(12) United States Patent
Pal et al.

(10) Patent No.: US 10,848,197 B2
(45) Date of Patent: Nov. 24, 2020

(54) HYBRID COUPLER BASED T/R SWITCH

(71) Applicant: pSemi Corporation, San Diego, CA (US)

(72) Inventors: Kashish Pal, San Diego, CA (US); Vikas Sharma, Reading (GB); Sebastian Diebold, Reading (GB)

(73) Assignee: pSemi Corporation, San Diego, CA (US)

( * ) Notice: Subject to any disclaimer, the term of this patent is extended or adjusted under 35 U.S.C. 154(b) by 67 days.

(21) Appl. No.: 15/971,992

(22) Filed: May 4, 2018

(65) Prior Publication Data

US 2019/0341960 A1 Nov. 7, 2019

(51) Int. Cl.
| | |
|---|---|
| *H04B 1/44* | (2006.01) |
| *H03F 3/21* | (2006.01) |
| *H04J 3/02* | (2006.01) |
| *H01P 5/16* | (2006.01) |

(52) U.S. Cl.
CPC .................. *H04B 1/44* (2013.01); *H01P 5/16* (2013.01); *H03F 3/21* (2013.01); *H04J 3/02* (2013.01); *H03F 2200/294* (2013.01)

(58) Field of Classification Search
CPC ..... H04B 1/44; H03F 3/21; H04J 3/02; H01P 5/16
See application file for complete search history.

(56) References Cited

U.S. PATENT DOCUMENTS

| 7,123,898 | B2 | 10/2006 | Burgener et al. | |
|---|---|---|---|---|
| 7,248,120 | B2 | 7/2007 | Burgener et al. | |
| 7,890,891 | B2 | 2/2011 | Stuber et al. | |
| 8,742,502 | B2 | 6/2014 | Brindle et al. | |
| 9,602,091 | B1* | 3/2017 | Sharma | H03H 11/28 |
| 9,722,551 | B1* | 8/2017 | McKinley | H03G 3/18 |
| 2009/0015323 | A1* | 1/2009 | Wyse | H03F 3/602 |
| | | | | 330/124 R |
| 2009/0278624 | A1* | 11/2009 | Tsai | H01P 1/18 |
| | | | | 333/167 |
| 2010/0026388 | A1* | 2/2010 | Plotka | H03F 3/602 |
| | | | | 330/124 R |

(Continued)

OTHER PUBLICATIONS

Sharma, Vikas, "Low Loss, Wide Band, Phase Shifter Utilizing Transformer", patent application filed Dec. 27, 2017, U.S. Appl. No. 15/855,901, 60 pgs.

*Primary Examiner* — Chi H Pham
*Assistant Examiner* — Weibin Huang
(74) *Attorney, Agent, or Firm* — Jaquez Land Greenhaus LLP; Alessandro Steinfl, Esq.

(57) ABSTRACT

A hybrid coupler-based T/R switch for use in a TDM system. An output hybrid coupler of a balanced amplifier is used to selectively switch a transmit or receive path to an antenna. During transmission, power at the output of the balanced amplifier is delivered directly to the antenna. During reception, power from the antenna is reflected through ports of the hybrid coupler connected to respective two amplifiers of the balanced amplifier, to constructively combine at a port of the coupler coupled to the receive path, with a ninety degrees phase shift. A pair of shunting switches coupled to the ports of the hybrid coupler connected to the two amplifiers, and a shunting switch coupled to the port coupled to the receive path, control operation of the hybrid coupler-based T/R switch.

24 Claims, 18 Drawing Sheets

(56) References Cited

U.S. PATENT DOCUMENTS

2017/0194688 A1\* 7/2017 Sharma .................... H01P 5/16
2017/0288607 A1\* 10/2017 Alijabbari .............. H03D 7/166
2018/0019722 A1\* 1/2018 Birkbeck ................ H03H 7/20
2019/0198957 A1\* 6/2019 Sharma ................... H04B 1/18

\* cited by examiner

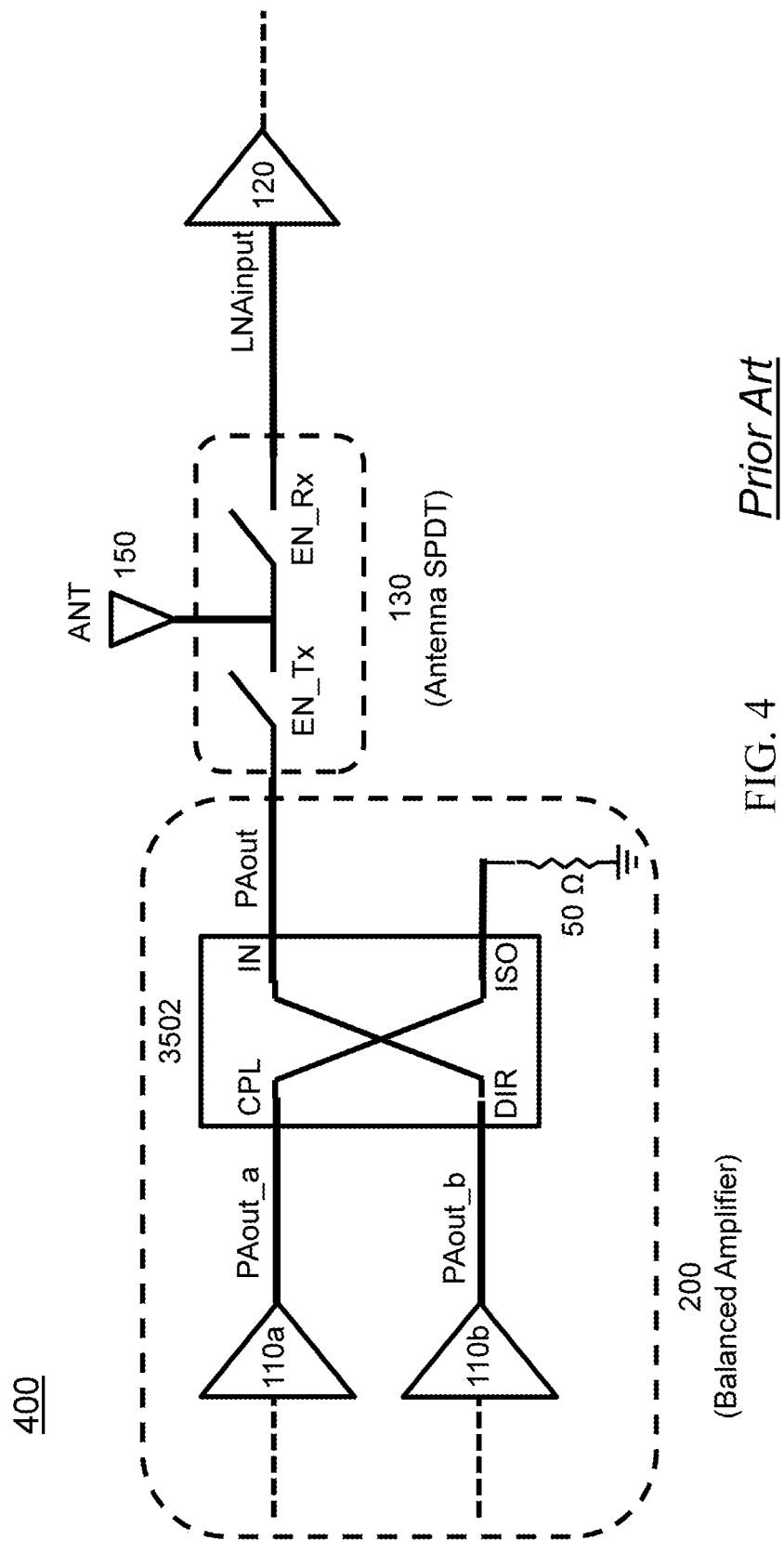
FIG. 4  *Prior Art*

Tx Mode: PA ON
LNA OFF

HYBRID COUPLER BASED T/R SWITCH

CROSS REFERENCE TO RELATED APPLICATIONS

The present application may be related U.S. Patent Publication No. 2017/0194688 A1, entitled "Reflection-Based RF Phase Shifter", published on Jul. 6, 2017, the disclosure of which is incorporated herein by reference in its entirety. The present application may also be related U.S. patent application Ser. No. 15/855,901, entitled "Low Loss, Wide Band, Phase Shifter Utilizing Transformer", filed on Dec. 27, 2017, the disclosure of which is incorporated herein by reference in its entirety.

TECHNICAL FIELD

The present teachings relate to radio frequency (RF) circuits. More particularly, the present teachings relate to methods and apparatuses for receive and transmit RF signal switching in a time-division multiplexed system.

BACKGROUND

In the time-division multiplexed (TDM) system 100A shown in FIG. 1A, one or more switches (EN_Tx, EN_Rx, configured, for example, as a SPDT switch) may be used to connect and disconnect an RF transmit path (110, . . . ) and an RF receive path (120, . . . ) to a common antenna (150) for respectively sending and receiving an RF signal via the common antenna (150). Such switches, generally known in the art as T/R switch (transmit/receive switch, 130), are designed to minimize signal loss between the common antenna (150) and the transmit/receive paths (110, . . . /120, . . . ), and to reduce any leakage from the high power RF transmit path (110, . . . ) into the low power and sensitive RF receive path (120, . . . ). The RF transmit path (110, . . . ) may include an RF amplifier (e.g., power amplifier, PA, 110) that amplifies an RF signal to be transmitted, at high power, through the antenna (150). Likewise, the RF receive path (120, . . . ) may include an amplifier (e.g., low noise amplifier, LNA, 120) that amplifies a low power RF signal received from the antenna (150) for further downstream processing. As shown in FIG. 1B and FIG. 1C, during a transmission phase and a reception phase of the TDM system of FIG. 1A, the T/R switch (130) respectively selectively connects the output of the transmit path (110, . . . ) and the input of the receive path (120, . . . ) to the common antenna (150) while disconnecting the other one of the transmit path and the receive path from the antenna. It should be noted that in some implementations, elements of the transmit path, such as for, example, the PA (110), can be deactivated during a receive phase of the TDM system (100A of FIG. 1A, 100C of FIG. 1C later described), and elements of the receive path, such as for, example, the LNA (120), can be deactivated during a transmit phase of the TDM system (100A of FIG. 1A, 100B of FIG. 1B later described). As it is well known to a person skilled in the art, activation and deactivation of such elements in view of a phase of operation of the system (100A) may be performed synchronous with control of the T/R switch (130), as performed, for example, by a signal aware controller such as a transceiver (not shown in FIG. 1A).

In some cases, the PA (110) and/or LNA (120) used in the transmit and receive paths of the TDM system may be balanced amplifiers that operate on phase-shifted signals, such as, for example, the ninety-degrees balanced amplifier (200) shown in FIG. 2. As it is well known to a person skilled in the art and shown in FIG. 2, the balanced amplifier (200) includes two amplifying devices (110a, 110b) that may operate in quadrature. That is, they operate 90 degrees apart, or in other words, they process/amplify RF signals of same power but in quadrature phase. A hybrid coupler (3501), also known as a quadrature coupler, provided at an input of the balanced amplifier (200), splits an input RF signal provided at an input node PAin of the amplifier, to two quadrature signals (i.e., 90 degrees apart) of substantially same power (e.g., amplitude) that are respectively fed to the two amplifying devices (110a, 110b). A second hybrid coupler (3502) at the outputs of the two amplifying devices (110a, 110b) constructively combines the two phase-shifted (quadrature) signals at respective output nodes, PAout_a and PAout_b, of the amplifying devices to generate a combined output RF signal at an output node PAout of the balanced amplifier (300) with a power that is substantially equal to the power of the input RF signal at input node PAin multiplied by the by the gain of the PA.

It should be noted that detailed description of such prior art discussed above is outside the scope of the present disclosure, as a person skilled in the art is well aware of it. For example, a person skilled in the art will recognize the hybrid coupler (350) shown in FIG. 3, having four ports: Coupled Port (CP), Direct Port (DP), Input Port (IP), and Isolated Port (ISO), with paths between two ports providing either zero degrees, 0°, phase delay or a ninety degrees, 90°, phase delay as shown in FIG. 3. For example, the hybrid coupler (350) can be used as a reflective phase shifter, where an input signal provided at the Input Port (IP) is split into two signals of equal power but ninety degrees, 90°, out of phase that are provided at the Coupled Port (CP) and the Direct Port (DP). In turn, the signals at ports CP and DP can reflect and combine in phase (constructively) at the Isolated Port (ISO) so long as the impedances at ports CP and DP are identical. Some description of usage of such hybrid coupler can be found, for example, in the above referenced U.S. Patent Publication No. 2017/0194688 A1 and U.S. patent application Ser. No. 15/855,901, the disclosures of which are incorporated herein by reference in their entirety.

A person skilled in the art knows the performance advantages of using balanced amplifiers in the transmit and/or receive paths of a TDM system, such as the system (400) shown in FIG. 4, including higher power handling, and higher immunity with respect to VSWR (voltage standing wave ratio) performance due to, for example, reduced losses to reflections arising from mismatched amplifiers. However, and with reference to FIG. 4, which shows coupling of the output stage hybrid coupler (3502) of the balanced amplifier (200) and of the LNA amplifier (120), to the T/R switch (130) of the prior art TDM system (400), such T/R switch (130) can introduce added mismatch as well as power dissipation through the T/R switch (130), and therefore negatively affect performance of the TDM system (400). For example, with further reference to FIG. 4, during a transmission phase of the TDM system (400), the EN_Tx switch of the T/R switch (130) is closed, and therefore the RFout signal output at node PAout of the balanced amplifier (200) can be attenuated due to an ON resistance of the EN_Tx switch. Likewise, during a reception phase of the TDM system (400), the EN_Tx switch of the T/R switch (130) is open, and therefore a corresponding OFF capacitance can introduce a mismatch condition between the antenna (150) and the input of the LNA amplifier (120) of the receive path.

It follows that there is a need to address negative effects on system performance due to the T/R switch used in a TDM system. This is a motivation for the teachings according to the present disclosure.

SUMMARY

According to a first aspect of the present disclosure, a circuit arrangement is presented, the circuit arrangement comprising: a balanced amplifier comprising an output hybrid coupler comprising a first port, CPL, a second port, DIR, a third port, ISO, and a fourth port, IN, the fourth port, IN, being configured for connection to an antenna; first and second shunting switches of a first set of switches, respectively coupled to the first port, CPL, and the second port, DIR; and a third shunting switch of the first set of switches coupled to the third port, ISO, through a series-connected terminating resistor; wherein during a first mode of operation of the circuit arrangement: the first and second shunting switches are open so that amplified phase-shifted signals of the balanced amplifier respectively coupled to the first port, CPL, and the second port, DIR, are combined at the fourth port, IN, and the third shunting switch is closed so to provide a terminating impedance to a residual signal of the amplified phase-shifted signals, and wherein during a second mode of operation of the circuit arrangement: the first and second shunting switches are closed so that a signal at the fourth port, IN, is divided at, and reflected from, the first port, CPL, and the second port, DIR, to combine at the third port, ISO, and the third shunting switch is open.

According to second aspect of the present disclosure, a circuit arrangement is presented, the circuit arrangement comprising: a balanced amplifier comprising an input hybrid coupler and an output hybrid coupler; and a first set of shunting switches, comprising first, second, and third shunting switches, respectively coupled to ports CPL, DIR, and IN of the input hybrid coupler, wherein open and closed states of the switches of the first set of shunting switches are configured to control operation of the input hybrid coupler as a hybrid coupler-based switch comprising a first state and a second state, wherein in the first state, a signal at the port ISO of the input hybrid coupler is divided at ports CPL and DIR of the input hybrid coupler to generate input quadrature signals for amplification by the balanced amplifier, and wherein in the second state, a signal at the port IN of the input hybrid coupler is divided at, and reflected from, the ports CPL and DIR of the input hybrid coupler, to combine at the ISO port of the input hybrid coupler.

According to a third aspect of the present disclosure, a time-division multiplexed system is presented, the time-division multiplexed system comprising: a transmit path comprising a balanced amplifier, the balanced amplifier comprising: i) an output hybrid coupler; ii) first and second quadrature amplification paths coupled to respective first and second ports of the output hybrid coupler; and iii) first and second shunting switches respectively coupled to the first and second ports; a receive path coupled to a third port of the hybrid coupler; a third shunting switch coupled to the third port by way of a terminating resistor; and an antenna connected to a fourth port of the hybrid coupler, wherein during a transmission phase of the time-division multiplexed system, the first and second shunting switches are open, and the third shunting switch is closed, so to deliver RF power from the balanced amplifier directly to the antenna, and wherein during a reception phase of the time-division multiplexed system, the first and second shunting switches are closed, and the third shunting switch is open, so to deliver RF power from the antenna to the receive path.

According to a fourth aspect of the present disclosure, a method for reducing an insertion loss in a transmit path of a time-division multiplexed system is presented, the method comprising: providing a balanced amplifier comprising an output hybrid coupler configured to output an amplified signal of the balanced amplifier at a port, IN, of the output hybrid coupler; coupling a first set of shunting switches, comprising first, second, and third shunting switches, to respective CPL, DIR, and ISO ports of the output hybrid coupler; based on the coupling and open/closed states of the first set of shunting switches, controlling the output hybrid coupler for operation as a hybrid coupler-based switch having two states: a transmit state and a receive state; wherein in the transmit state, the hybrid coupler-based switch combines at the IN port, amplified quadrature signals of the balanced amplifier respectively coupled to the CPL and DIR ports, thereby delivering RF power directly to an antenna connected to the IN port, and wherein in the receive state, the hybrid coupler-based switch combines at the ISO port, reflected signals from the CPL and DIR ports, the reflected signals being based on a division of a signal at the IN port that is received from the antenna, thereby delivering RF power from the antenna to a receive path coupled to the ISO port.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 4 shows coupling of an output stage hybrid coupler of a balanced amplifier of a transmit path of a TDM system to the T/R switch.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios) having a plurality of devices, such as for example, transistors (e.g., MOSFETs). Persons skilled in the art will appreciate that such electrical circuits comprising transistors can be arranged as amplifiers.

As used herein, the expression "operating frequency" can refer to a frequency of a signal being input to a device (such as an amplifier).

Apparatus and methods that provide switching function between a common antenna and, receive and transmit paths of a TDM system, by way of a hybrid coupler coupled at an output stage of an amplifier of the transmit path of the TDM system are presented. Accordingly, transmission and reception of an RF signal to and from a common antenna of the TDM system can be performed free of a series-connected T/R switch, and therefore with an overall lower signal loss when compared to the prior art TDM system using a T/R switch. Furthermore, other advantages inherent to using of a balanced amplifier configuration can be maintained while removing the negative effects of the T/R switch, resulting in a lower insertion loss, a more compact physical layout, and a wide frequency range of operation (e.g. DC up to 1 GHz, 10 GHz, 50 GHz and beyond). It should be noted that teachings according to the present disclosure equally apply to any system or method for receiving and transmitting signals according to a time division scheme from and to a common antenna, including, for example, time-division duplex (TDD) systems.

Figure 5A:
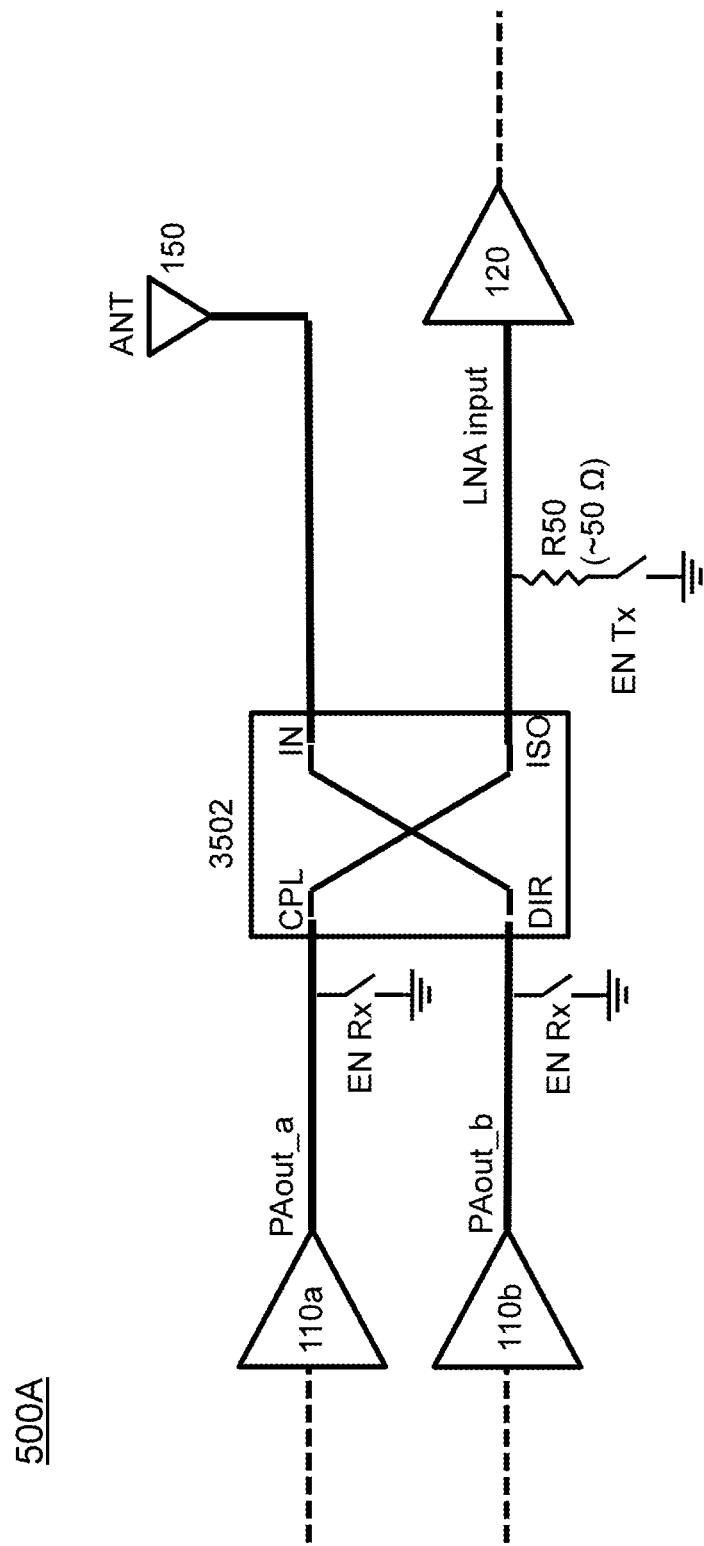
FIG. 5A shows a block diagram of a TDM system according to an embodiment of the present disclosure comprising a balanced amplifier whose output stage hybrid coupler performs the task of a T/R switch.

FIG. 5A shows a block diagram of a TDM system (500A) according to an embodiment of the present disclosure comprising a balanced amplifier (200) whose output stage hybrid coupler (3502) performs the task of the T/R switch (130) discussed above in reference to the prior art. A person skilled in the art clearly understands that the balanced amplifier (200) is part of a transmit path of the TDM system (500A) which may include additional components, active or passive, coupled to the balanced amplifier (200). Operation between transmission phase and reception phase of the TDM system (500) can be controlled/selected by way of a pair of shunting switches, EN_Rx, coupled (i.e., connected) to respective ports CPL and DIR of the hybrid coupler (3502), and a shunting switch (EN_Tx) coupled to the ISO port of the hybrid coupler (3502) via a series-connected resistor R50. As can be seen in FIG. 5A, by way of the architecture of the balanced amplifier (200), the pair of shunting switches, EN_Rx are also connected to a respective output node, PAout_a and PAout_b, of the amplifier devices (110a) and (110b) of the balanced amplifier (200). Furthermore, as can be seen in FIG. 5A, the shunting switch EN_Tx is coupled to the input of the LNA amplifier (120). The IN port of the hybrid coupler (3502) is connected to the antenna (150) of the TDM system (500A). It should be noted that the shunting switches EN_Rx and EN_Tx may be any type of switch known to a person skilled in the art, including and not limited to a FET based switch comprising one or more stacked FETs, as described, for example, in U.S. Pat. No. 7,890,891, issued on Feb. 15, 2011, entitled "Method and Apparatus Improving Gate Oxide Reliability by Controlling Accumulated Charge", the disclosure of which is incorporated herein by reference in its entirety. A person skilled in the art would clearly understand that as used in the present disclosure, and as shown, for example, in FIG. 5A, a "shunting switch" refers to a switch with one terminal connected to a reference ground so that the other terminal of the switch can be selectively shunted to the reference ground when the switch is closed.

With further reference to the TDM system (500A) according to the present disclosure, shown in FIG. 5A, open or close positions of the pair of shunting switches, EN_Rx, can affect an impedance at ports CPL and DIR of the hybrid coupler (3502) and in turn affect RF signals reflected from these ports. This is used to selectively redirect RF power (i.e., input RF signal) at the antenna (150) to the input of the LNA amplifier (120) during a reception phase of the TDM system (500A) with a reduced loss when compared to the prior art system using a T/R switch (e.g., FIG. 4). Additionally, since no T/R switch is used in the TDM system (500A), RF power loss and mismatch issues caused by such T/R switch can be avoided. Finally, as there is no direct conduction path between the antenna (150) and the input of the LNA amplifier (120), ESD protection to the input of the LNA amplifier (120) is provided by the TDM system (500A).

Figure 2:
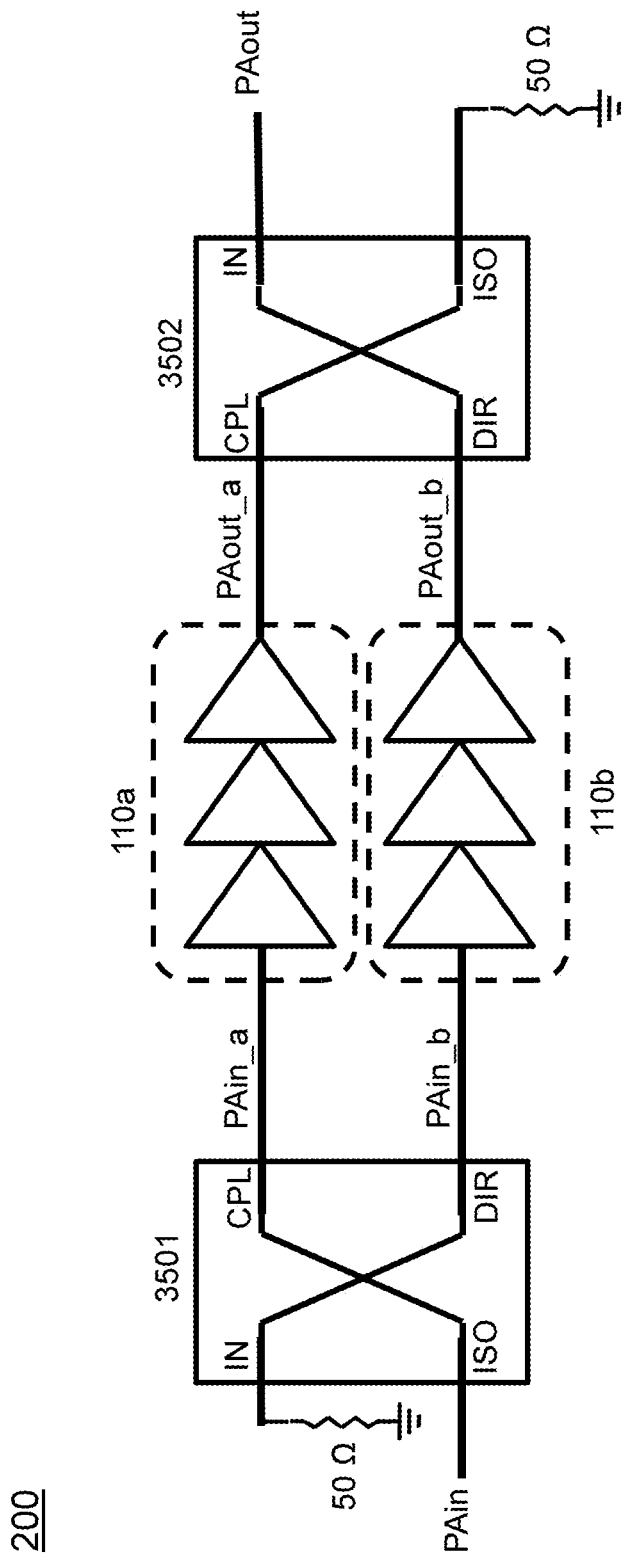
FIG. 2 shows a block diagram of a prior art (ninety-degree) balanced amplifier comprising an input stage hybrid coupler, an output stage hybrid coupler, and two substantially identical amplifiers.
Figure 3:
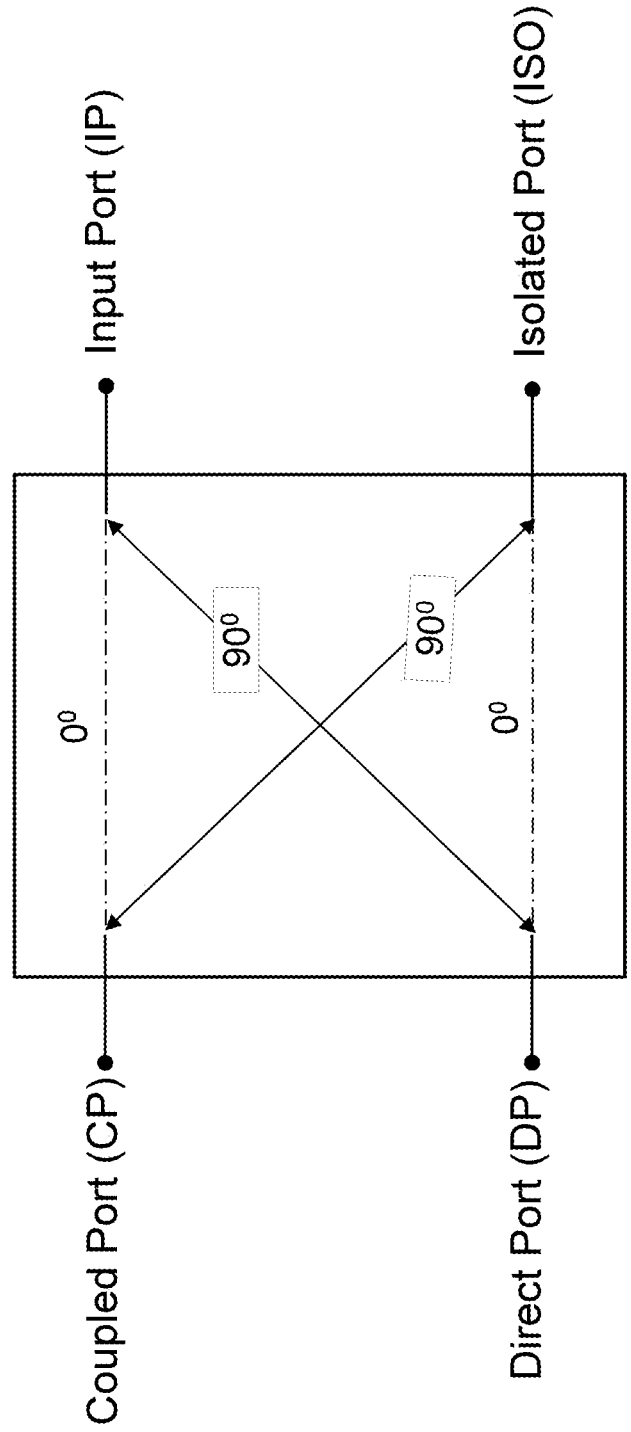
FIG. 3 shows a prior art hybrid coupler.
Figure 5B:
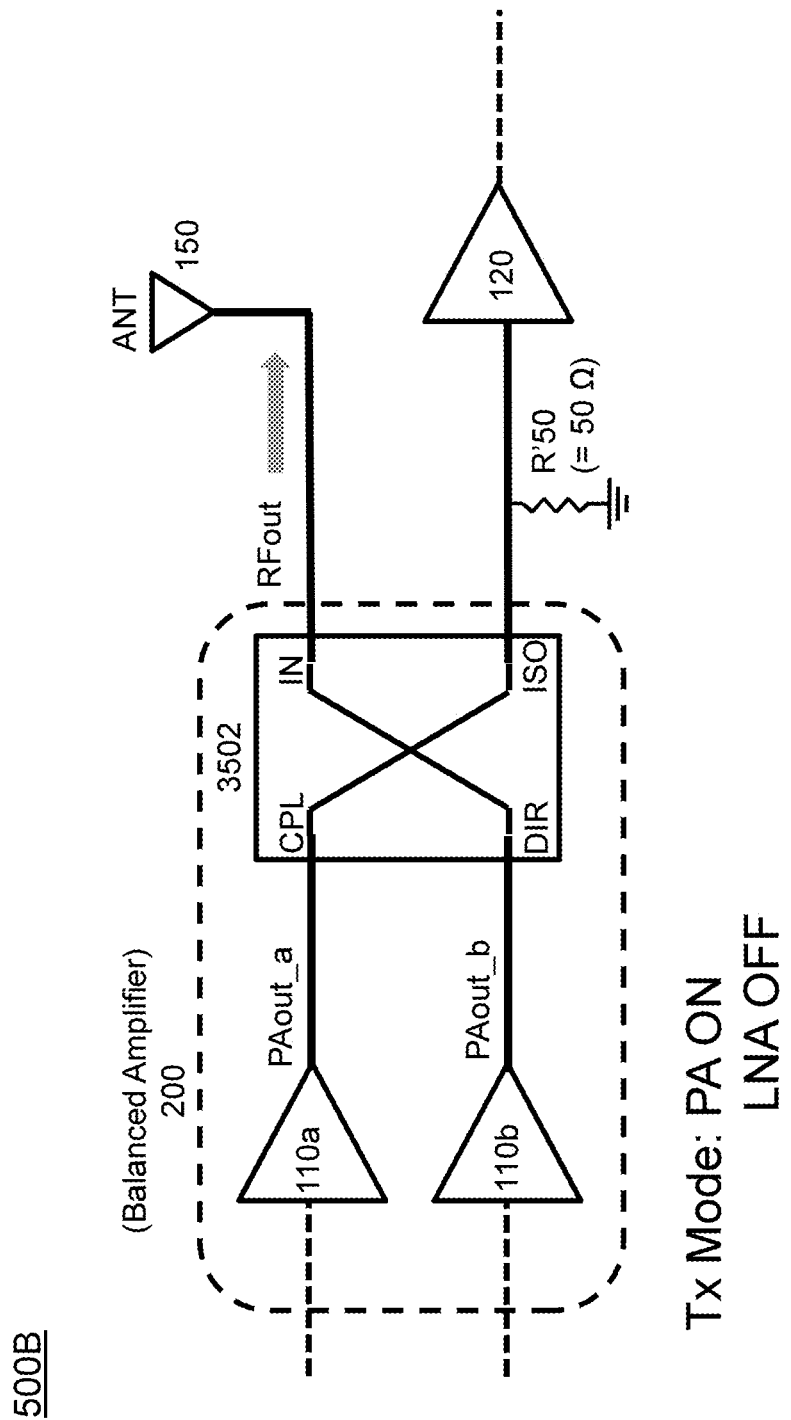
FIG. 5B shows the TDM system of FIG. 5A during a transmission phase of the TDM system.

FIG. 5B shows the TDM system of FIG. 5A during a transmission phase of the TDM system. During the transmission phase, each of the pair of shunting switches, EN_Rx, is in its respective open state, and therefore equivalent to a high impedance conduction path that is represented in FIG. 5A as an open. On the other hand, the shunting EN_Tx switch is closed, and therefore represented in FIG. 5B as an equivalent resistance R'50 with a value that is equal to a sum of the ON resistance of the switch EN_Tx and the resistance of the series-connected resistor R50. According to a non-limiting exemplary embodiment of the present disclosure, and as shown in FIG. 5B, the resistance value of R50 can be chosen so that the equivalent resistance R'50 is substantially equal to 50 Ohms. A person skilled in the art will recognize that the configuration of FIG. 5B is similar to the prior art configuration shown in FIG. 2 described above, and therefore all advantages provided by such prior art configuration are maintained during operation in the transmission phase of the TDM system (500A) according to the present teachings. A person skilled in the art would appreciate that, as can be seen in FIG. 5B, power from the output of the balanced amplifier (200) is delivered directly to the antenna (150) and without being subjected to an attenuation path such as one provided by the T/R switch of the prior art.

With continued reference to FIG. 5B, the quadrature amplified signals at nodes PAout_a and PAout_b, respectively coupled to ports CPL and DIR of the hybrid coupler (3502), divide substantially equally at ports IN and ISO with phase relationships so to constructively combine at the IN port of the hybrid coupler (3502) to provide the RFout signal transmitted at the antenna (150), and destructively cancel at the ISO port. Furthermore, any residual (non-canceled) signal at the ISO port due, for example, to unmatched amplifiers and/or couplers of the balanced amplifier (200), is terminated (e.g., dissipated) into the resistance R'50.

Figure 5C:
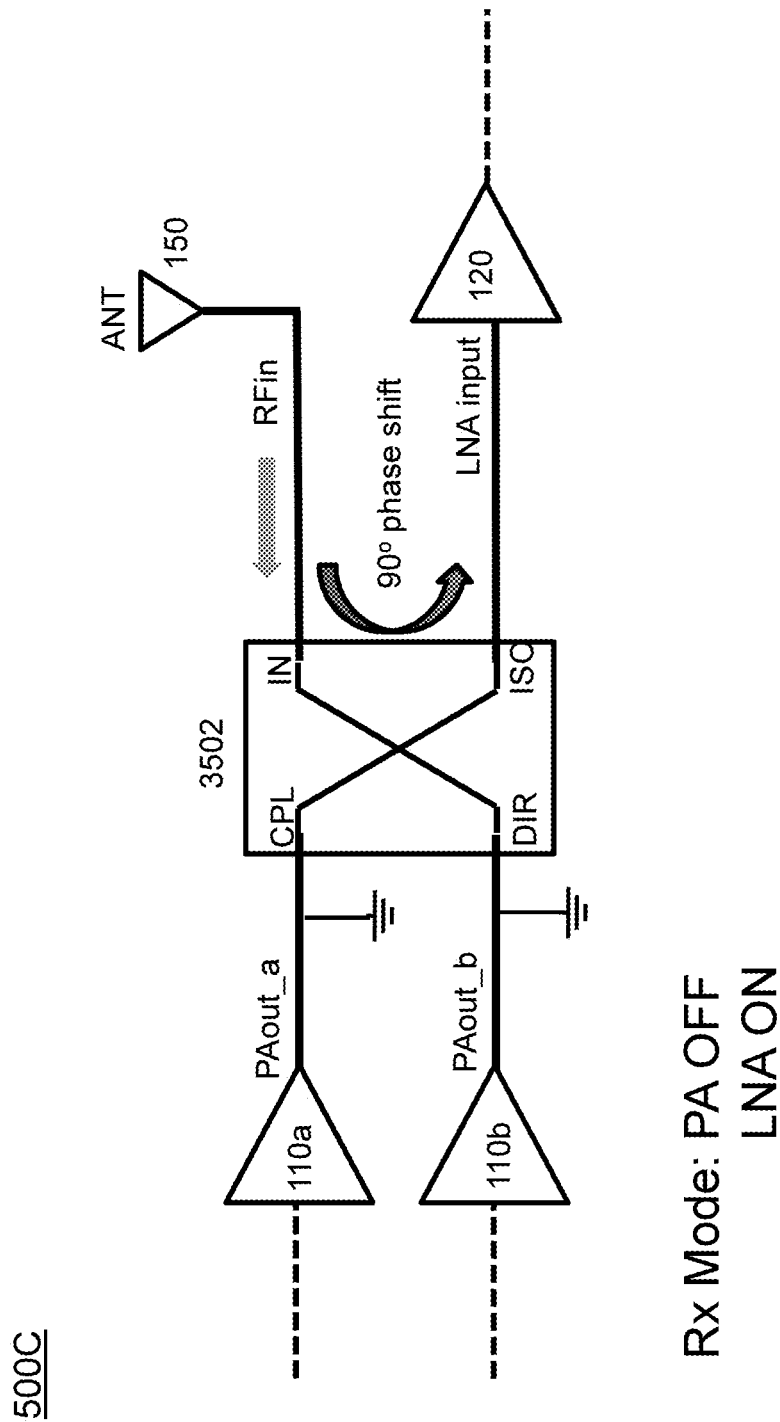
FIG. 5C shows the TDM system of FIG. 5A during a reception phase of the TDM system.

FIG. 5C shows the TDM system of FIG. 5A during a reception phase of the TDM system. During the reception phase, each of the pair of shunting switches, EN_Rx, is in its respective closed state, and therefore equivalent to a low impedance conduction path that is represented in FIG. 5A as a short. On the other hand, the shunting EN_Tx switch is open, and therefore represented in FIG. 5B as an equivalent high impedance open. Accordingly, an RFin signal received at the antenna (150) is coupled to the IN port of the hybrid coupler (3502) and divided equally at ports CPL and DIR of the coupler. In turn, such divided and in quadrature signals at ports CPL and DIR are reflected to the ISO port where they constructively combine to form an RF signal as input RF signal to the LNA amplifier (120). Because the divided signals reflected at ports CPL and DIR each see a same and substantially equal impedance of zero Ohms (at a frequency of operation of the RF signal), no additional phase shift beyond the ninety degrees phase shift provided by the coupler (3502) is provided to the input RF signal. A person skilled in the art would understand that additional phase shift to the input RF signal may be provided by selecting non-zero impedances at the reflective ports CPL and DIR as described, for example, in the above referenced U.S. patent application Ser. No. 15/855,901, the disclosure of which is incorporated herein by reference in its entirety.

With reference back to FIG. 5B, a person skilled in the art would understand that in a practical implementation, an input impedance of the LNA amplifier (120) at a frequency of operation of the RF signal when the LNA amplifier is deactivated (e.g., during the transmission phase) may not be infinite, or several orders of magnitude higher than the terminating resistance R'50, and therefore may combine with the terminating resistance R'50 to effectively provide an impedance seen by the port ISO looking into the LNA amplifier (120) that is different from a desired system impedance, such as, for example, 50 Ohms. In turn, such mismatch in termination impedance at the ISO port can deteriorate a return loss performance at the antenna (150). It follows that according to a further embodiment of the present disclosure, tuning of a termination impedance at the ISO port can be provided substituting the combination of the EN_TX switch and the series-connected resistor R50 shown in FIG. 5A, by a combination of a similar shunting EN_TX switch in series connection with a resistor, $R_{tune}$, and a capacitor, $C_{tune}$, as shown in FIG. 6A.

Figure 6A:
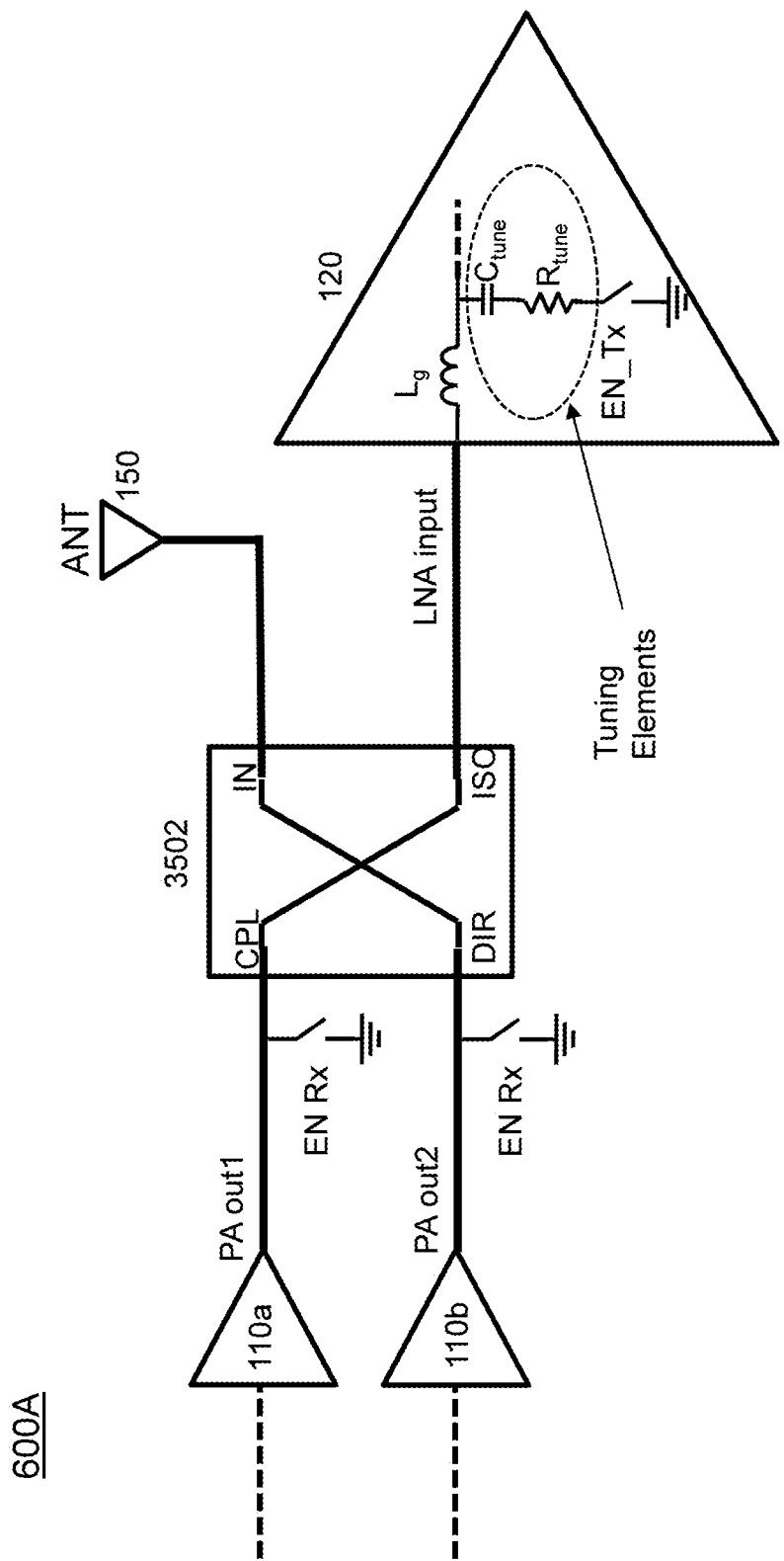
FIG. 6A shows an exemplary embodiment according to the present disclosure of the TDM system of FIG. 5A, where tuning elements are used in the receive path to adjust an impedance seen by the output stage hybrid coupler looking into the receive path.

FIG. 6A shows an exemplary embodiment according to the present disclosure of a TDM system (600A) based on the TDM system (500A) of FIG. 5A, where tuning elements are used in the receive path to adjust an impedance seen at the ISO port of the hybrid coupler (3502) looking into the LNA amplifier (120) of the receive path. In particular, FIG. 6A shows some internal details of the LNA amplifier (120), including an input inductance Lg of the LNA amplifier (120) that is inherent to the design of such amplifier. A person skilled in the art is well ware of LNA design practices where such input inductance Lg is commonly used, for example, in the input match of a common source LNA. The combination of the series-connected tuning elements, comprising the resistor $R_{tune}$, and the capacitor, $C_{tune}$, in series-connection with the shunting EN_TX switch, is coupled to the input inductance Lg at a node that is away from the ISO port of the hybrid coupler (3502). A person skilled in the art would know that many different LNA topologies, input matching networks, and thus input impedances are possible. The teachings according to the present disclosure equally apply to such different topologies, wherein a tuning circuit provides a net input impedance approximating a desired termination resistance when the LNA is in the OFF state and provides a good input match when the LNA is in the ON state.

Figure 6B:
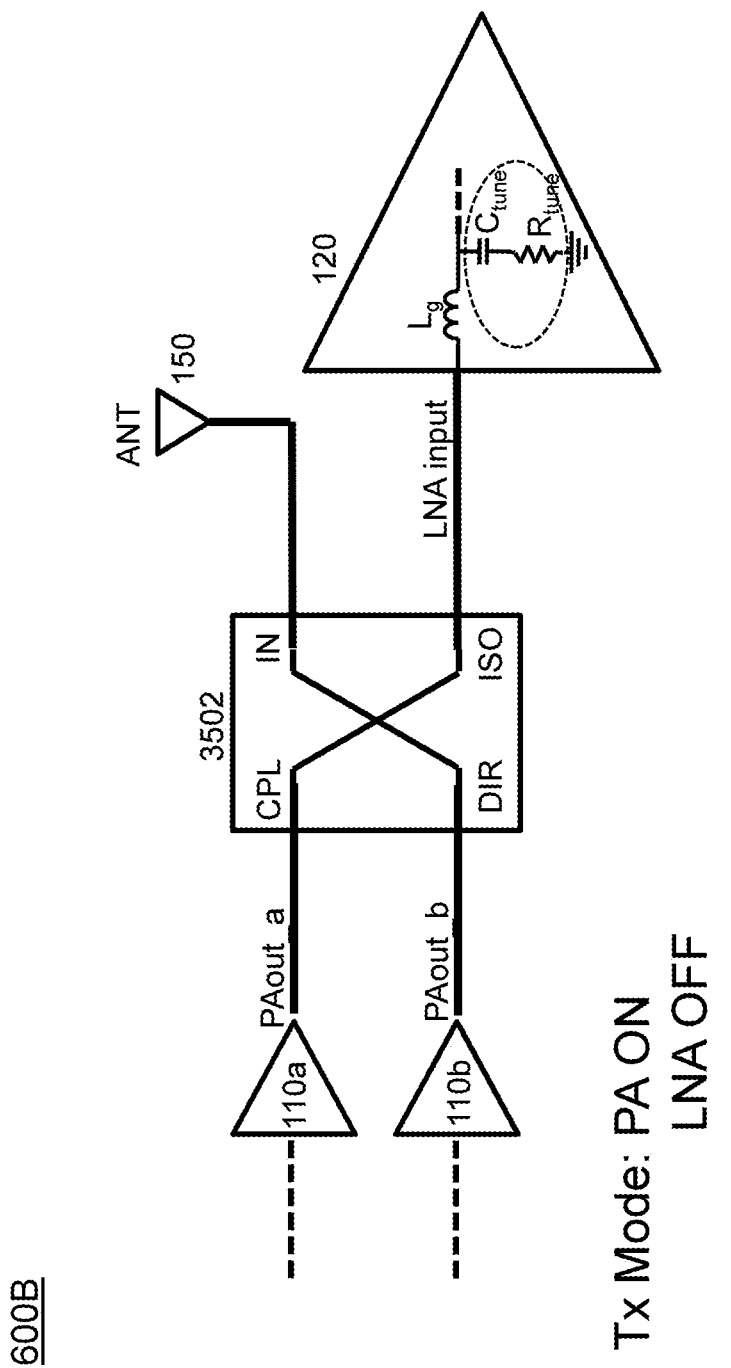
FIG. 6B shows the TDM system of FIG. 6A during a transmission phase of the TDM system.

As shown in FIG. 6B, during the transmission phase of operation of the TDM system of FIG. 6A, an impedance seen at the ISO port of the hybrid coupler (3502) is a resistive-reactive impedance provided by series connection of the inductance Lg and the tuning elements $R_{tune}$ and $C_{tune}$. A person skilled in the art would appreciate the flexibility in tuning of such resistive-reactive impedance, which clearly can provide, by selecting appropriate values of the tuning elements, a desired terminating impedance at the ISO port of the hybrid coupler (3502) at the frequency of operation. Selection of the appropriate values may be based on circuit simulation and/or effective in circuit measurements, or any other known methods to a person skilled in the art. Alternatively, or in addition, the tuning elements $R_{tune}$ and $C_{tune}$ may be in-circuit programmable, adjustable, settable, or controllable elements via any circuits known to a person skilled in the art.

Figure 6C:
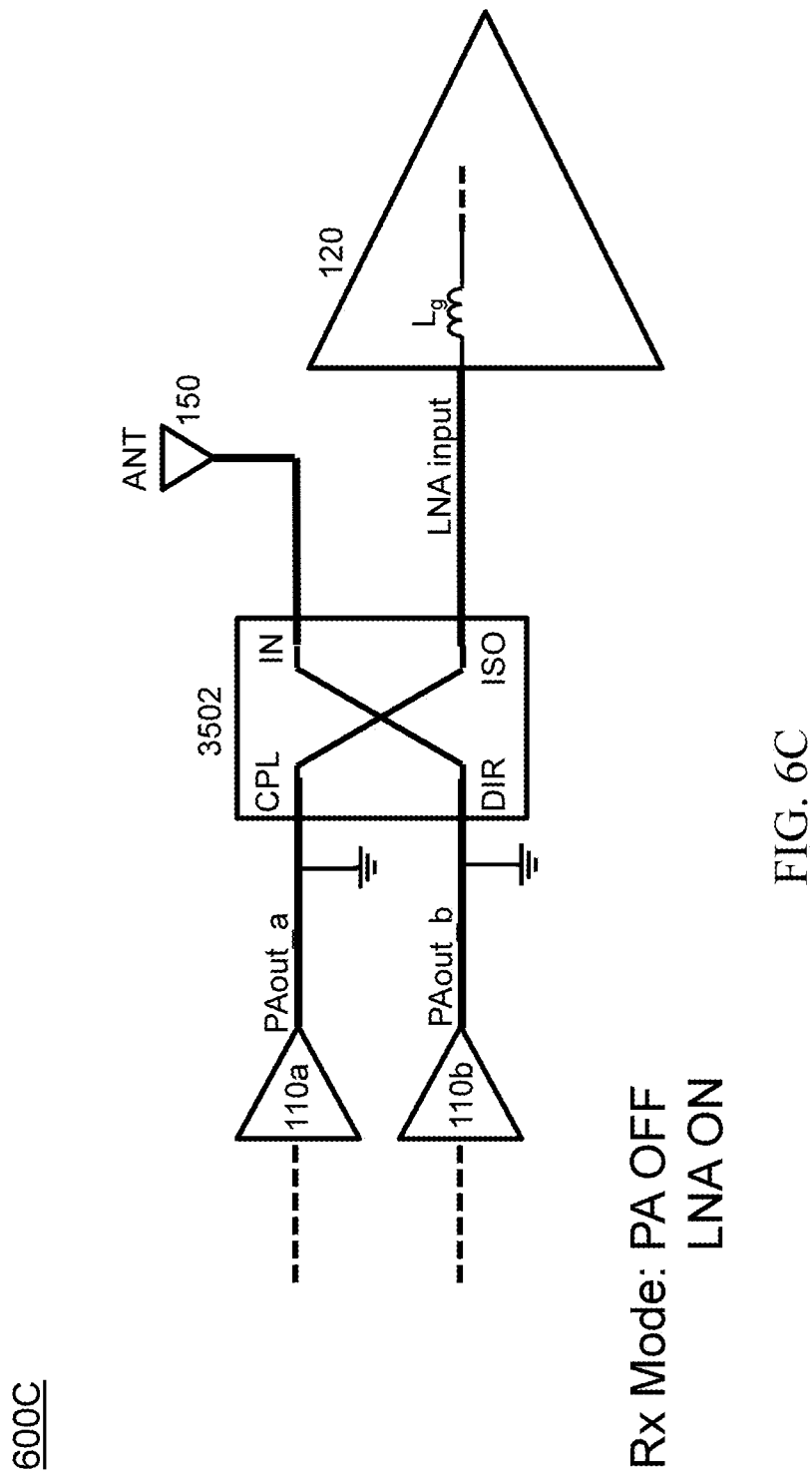
FIG. 6C shows the TDM system of FIG. 6A during a reception phase of the TDM system.

FIG. 6C shows configuration during the reception phase of operation of the TDM system of FIG. 6A. In this case, as the shunting switch EN_TX is open, no low impedance conduction path to ground (e.g., AC ground) can be provided to the series-connected tuning elements $R_{tune}$ and $C_{tune}$, and therefore such elements become effectively decoupled (as no current flows through them) from a signal path comprising the Lg inductance. It follows that the tuning element do not affect the received RF signal during the reception phase of operation of the TDM system shown in FIG. 6A.

As noted above, during the transmission phase of operation, mismatch, for example, in the amplifiers (e.g., 110a, 110b) and/or hybrid couplers (e.g., 3501, 3502) of the balanced amplifier, and even in some cases in the antenna (150), used in the TDM system (500A) shown in FIG. 5A, can result in a residual (non-canceled) signal at the ISO port, which is terminated (e.g., dissipated) into the resistance R'50. As power handled by the transmit path and antenna (150) during the transmission phase can be several orders of magnitude larger than power handled by the receive path and antenna (150) during the reception phase, even a fractional part of a transmission power representing the residual signal at the ISO port of the hybrid coupler (3502) can be damaging to the low power circuitry of the LNA amplifier (120). It follows that according to a further embodiment of the present disclosure shown in FIG. 7A, increased isolation between the ISO port of the hybrid coupler (3502) and the input of the LNA amplifier (120) can be provided via insertion of a switchable conduction path (720) between the ISO port of the hybrid coupler (3502) and the input of the LNA amplifier (120).

Figure 7A:
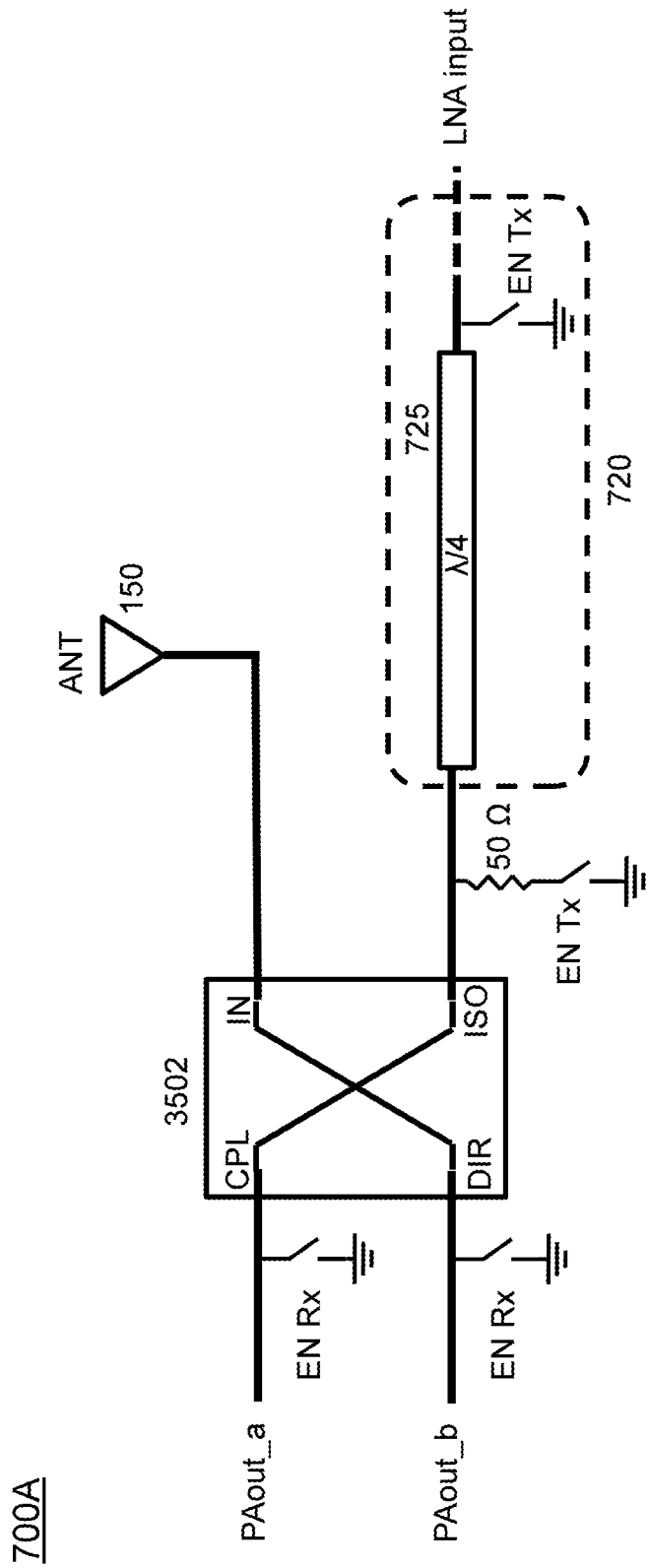
FIG. 7A shows an exemplary embodiment according to the present disclosure of the TDM system of FIG. 5A, where a quarter wavelength transmission line coupled to a switch are used are used in the receive path to further control an impedance seen by the output stage hybrid coupler looking into the receive path.

FIG. 7A shows an exemplary embodiment of a TDM system (700A) according to the present disclosure that is based on the TDM system of FIG. 5A, where a quarter wavelength, ¼λ, transmission line (725), with λ representing a wavelength corresponding to an operating frequency of the RF signal, is coupled, at one end of the transmission line (725), to the ISO port of the hybrid coupler (3502), and at the other end of the ¼ λ transmission line (725), to the input of the LNA amplifier (120)). A person skilled in the art readily knows of many possible design implementations for such transmission line which are beyond the scope of the present application. A person skilled in the art would realize that operation of the switchable conduction path (720) is according to an SPST switch function, which may also be realized by, for example, adding a series or series and shunt switch, or any other design known to the skilled person. Additionally, it should be noted that although the various embodiments according to the present disclosure do not require a switch in series connection in the receive path, some practical implementation tradeoffs may dictate the addition of such switch.

Figure 7B:
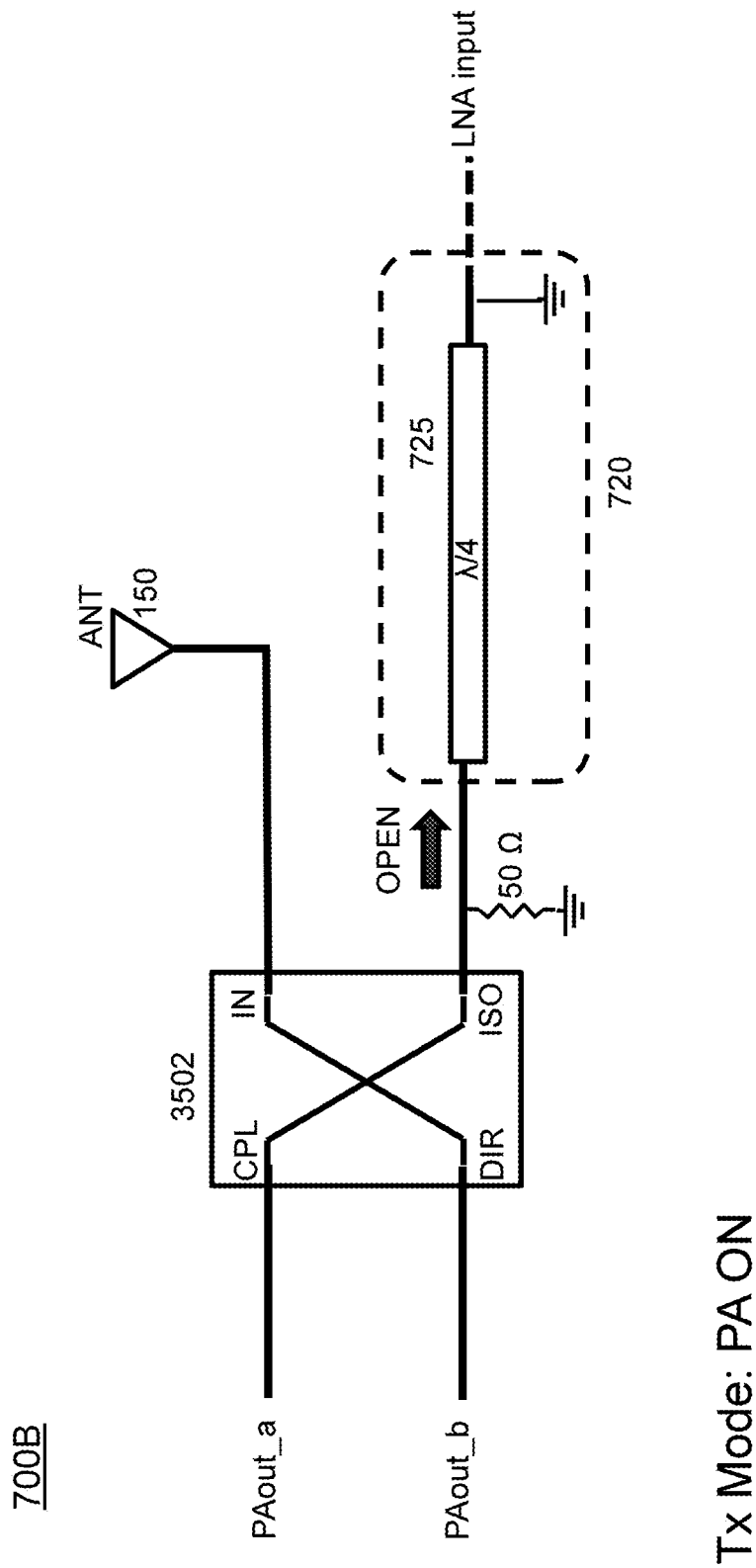
FIG. 7B shows the TDM system of FIG. 7A during a transmission phase of the TDM system.
Figure 7C:
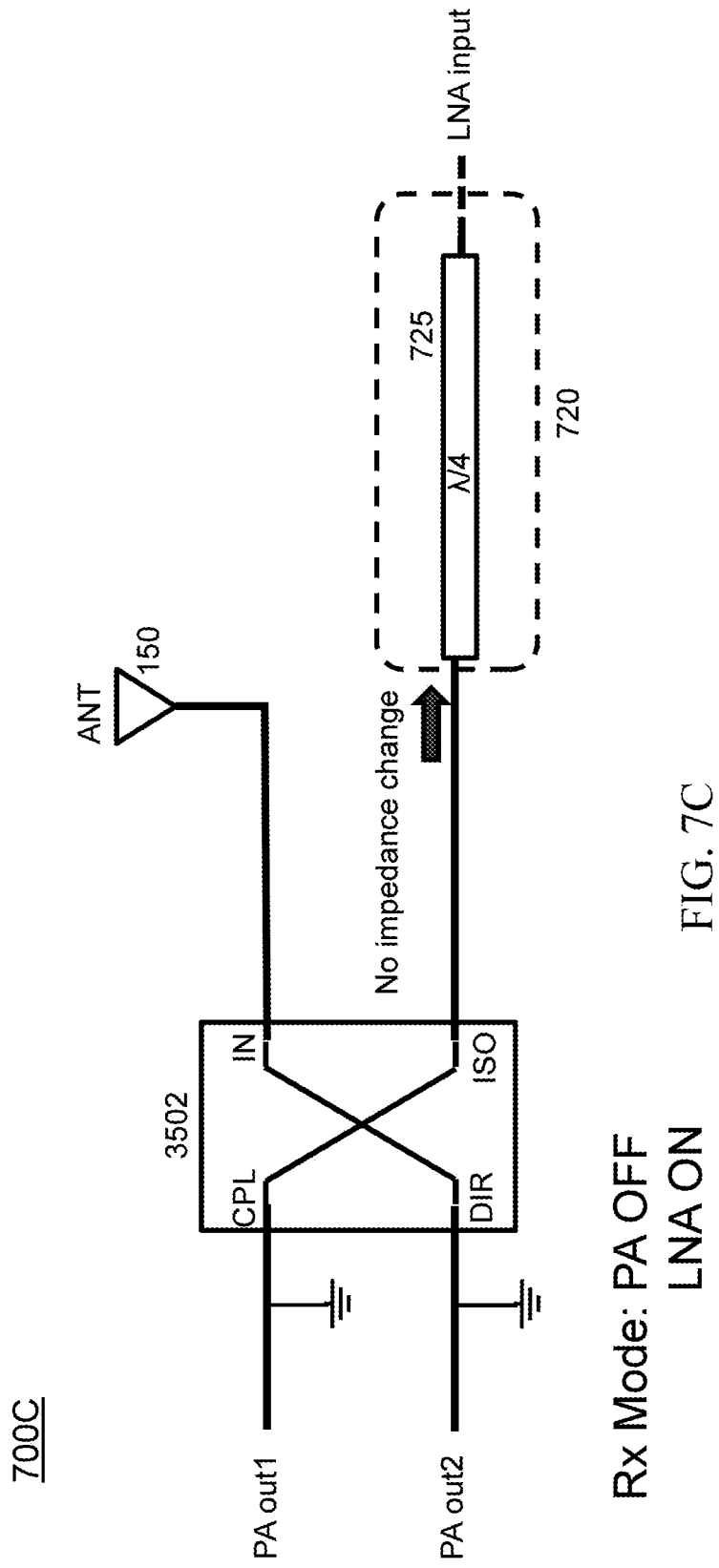
FIG. 7C shows the TDM system of FIG. 7A during a reception phase of the TDM system.

With further reference to FIG. 7A, an additional shunting EN_Tx switch is coupled to the end of the ¼ λ transmission line (725) that is coupled to the input of the LNA amplifier (120). A person skilled in the art clearly understands the principle of operation of the switchable conduction path (720) defined by the combination of the ¼ λ transmission line (725) coupled to the additional shunting EN_Tx switch. That is, closing the additional shunting EN_Tx switch makes the ISO port see an open circuit (high impedance) through the conduction path leading to the input of the LNA amplifier (120), and opening the additional shunting EN_Tx switch causes the input impedance of the LNA amplifier (120) to be seen through an impedance transformed conduction path between the ISO port and the input of the LNA amplifier (120). Accordingly, as can be seen in FIG. 7B, closing both of the shunting EN_Tx switches during the transmission phase, isolates the input of the LNA amplifier (120) from the ISO port of the hybrid coupler (3502). On the other hand, as can be seen in FIG. 7C, opening both of the shunting EN_Tx switches during the reception phase, provides an equivalent short, or a non-attenuating conduction path (e.g., phase shift but no signal loos), through the switchable conduction path (720) that effectively connects the ISO port and the LNA input.

Figure 1A:
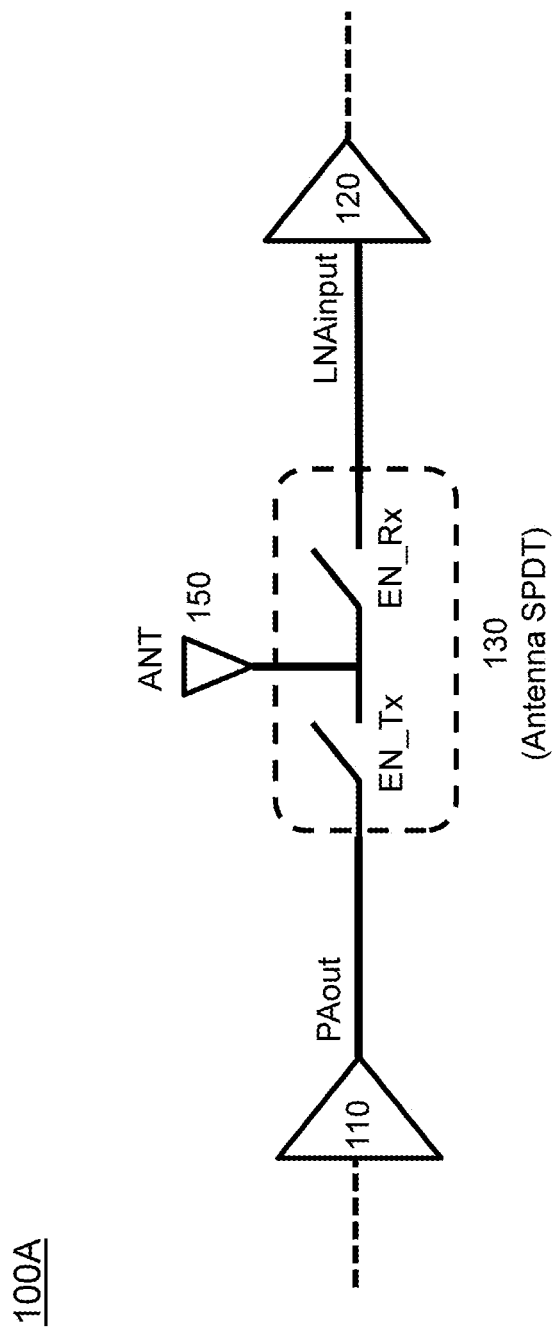
FIG. 1A shows a block diagram of a prior art transmit/receive (T/R) switch of a time-division multiplexed (TDM) system.
Figure 1B:
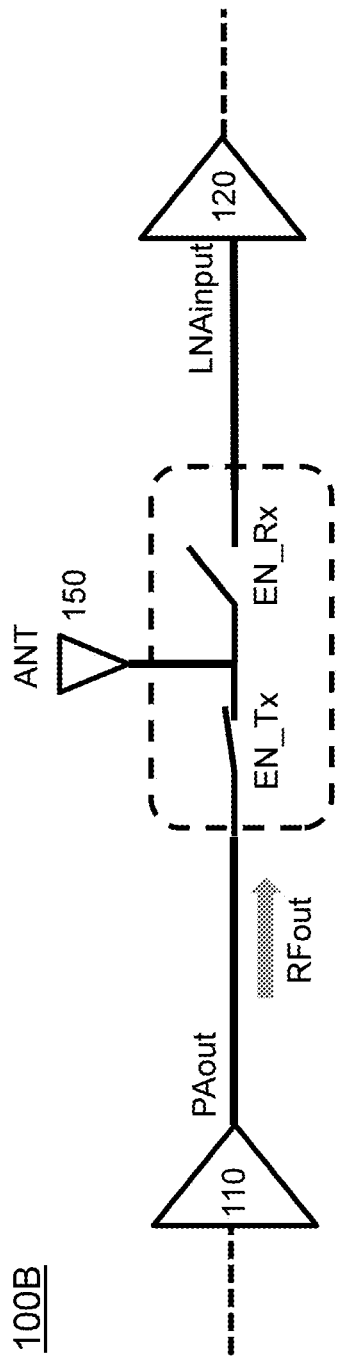
FIG. 1B shows the prior art transmit/receive (T/R) switch during a transmission phase of the TDM system.
Figure 1C:
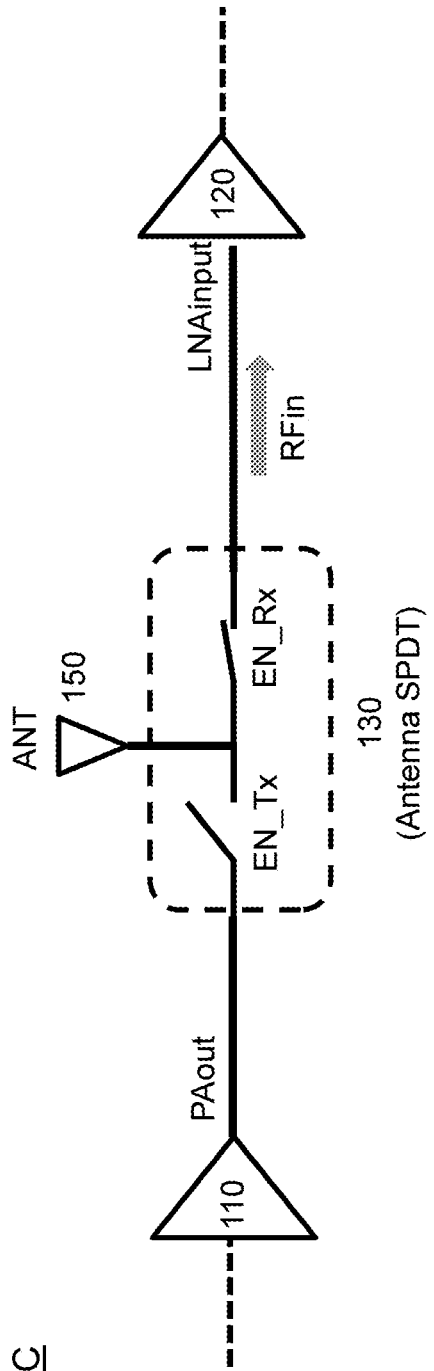
FIG. 1C shows the prior art transmit/receive (T/R) switch during a reception phase of the TDM system.
Figure 8A:
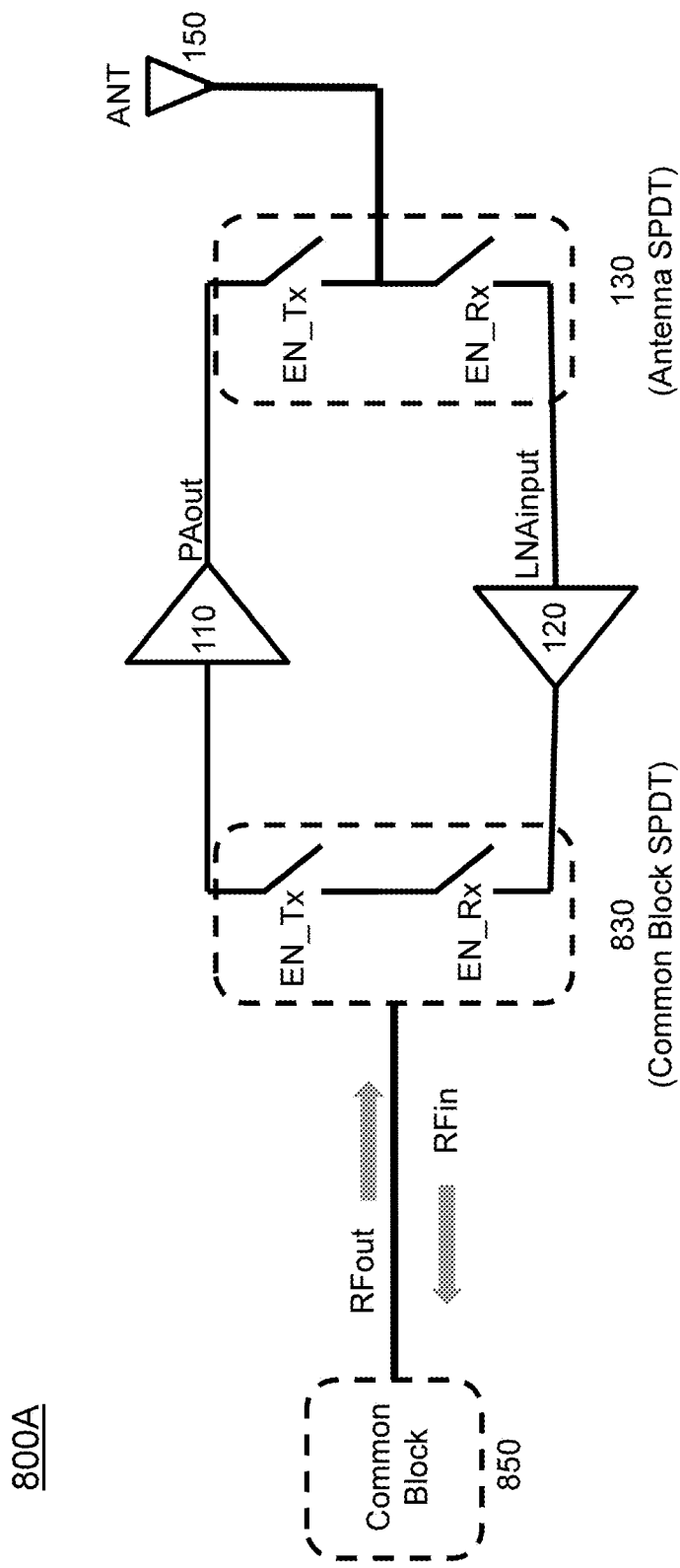
FIG. 8A shows a block diagram of a prior art TDM system wherein a common signal processing block for processing receive and transmit signals is accessed via a T/R switch.

In some cases, the front end of a TDM system, such as one shown in FIG. 1A, connects to independent transmit and receive paths (connections to amplifiers 110 and 120 not shown). These independent transmit and receive paths may be in a same transceiver IC, but the processing of the signals may be different and by way of processing paths that are usually not shared. However, there may be cases where the transmit and receive paths do share some common elements and therefore common processing paths. An example is, for example, a T/R path of a phased array antenna as known to a person skilled in the art. In this case, a common amplitude and phase control block can be shared by the transmit and receive paths because of the time-division nature of the system. FIG. 8A shows a prior art bi-directional amplifier block (800A) that can be alternately used to transmit signals, via amplifier (110) coupling to the antenna (150), and receive signals, via the amplifier (120) coupling to the antenna (150). The common processing functions for transmitted and received signals, such as, for example, amplitude and phase shift functions, may be performed via a switched connection to a common block (850) that is selectively provided by the common block SPDT switch (830) as shown in FIG. 8A. An example application of such a circuit configuration may be a phase array element controller and front end. The phase shifter, amplitude controller, or both phase and amplitude control could be common to both receive and transmit operation in, for example, a TDD system. These common blocks are then switched to the LNA and PA and eventually to the antenna (150). As a further example, this type of circuit can be used in millimeter wave 5G communication systems or any phased array antenna system.

As discussed above with reference to the prior art configuration of FIG. 1A, similarly to the T/R switch (130), the switch (830) can be a source of performance loss in the configuration depicted in FIG. 8A. It follows, that according to a further embodiment of the present disclosure as shown in FIG. 8B, the input hybrid coupler (3501), which as discussed above with reference to FIG. 2 is part of the prior art balanced amplifier (200), can also be used to perform the task of selectively switching the receive and transmit path RF signals to and from the common block (850).

Figure 8B:
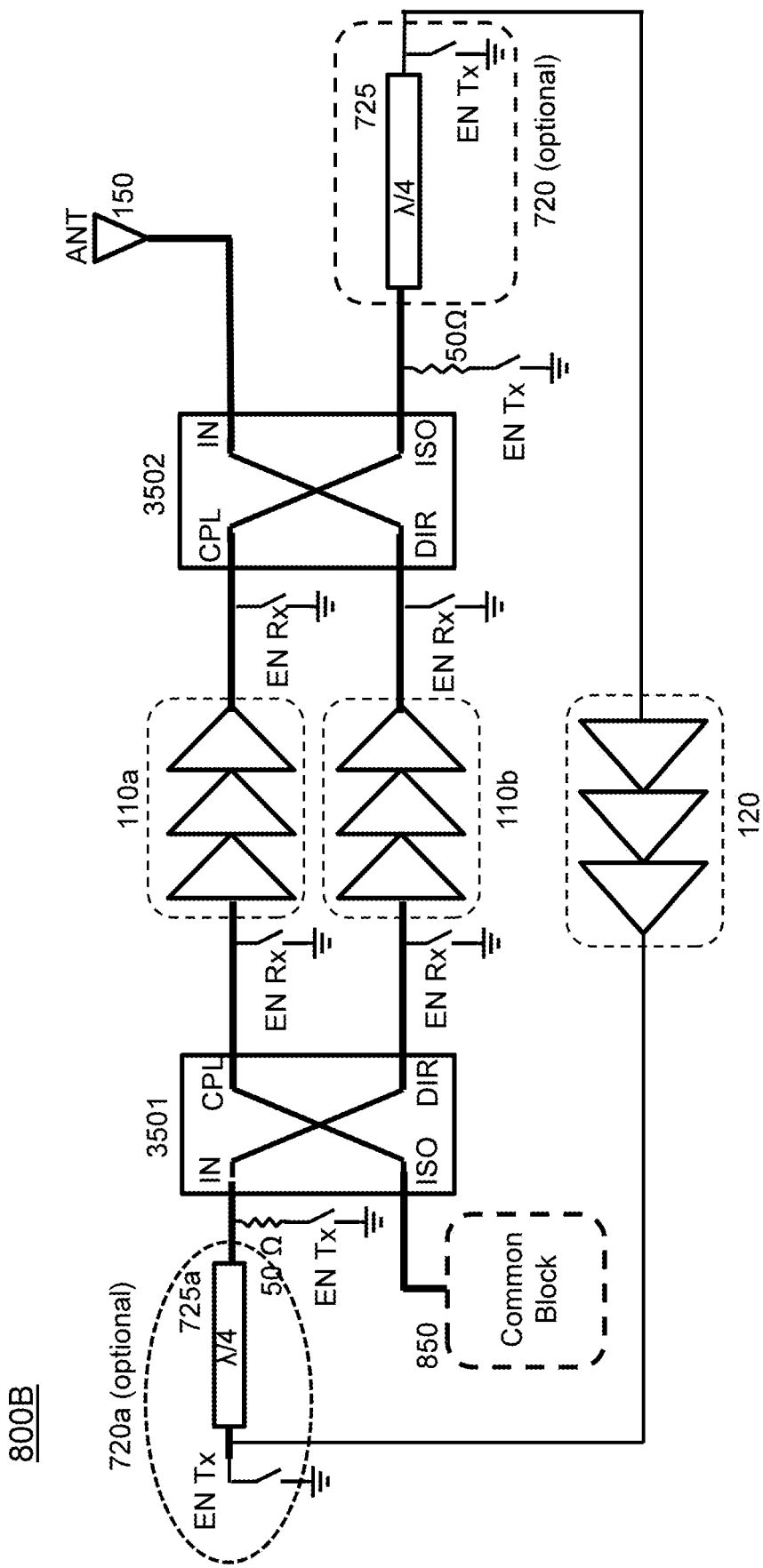
FIG. 8B shows a block diagram of a TDM system according to an embodiment of the present disclosure comprising a balanced amplifier whose input stage hybrid coupler and output stage hybrid coupler each perform the task of a T/R switch.
Figure 8C:
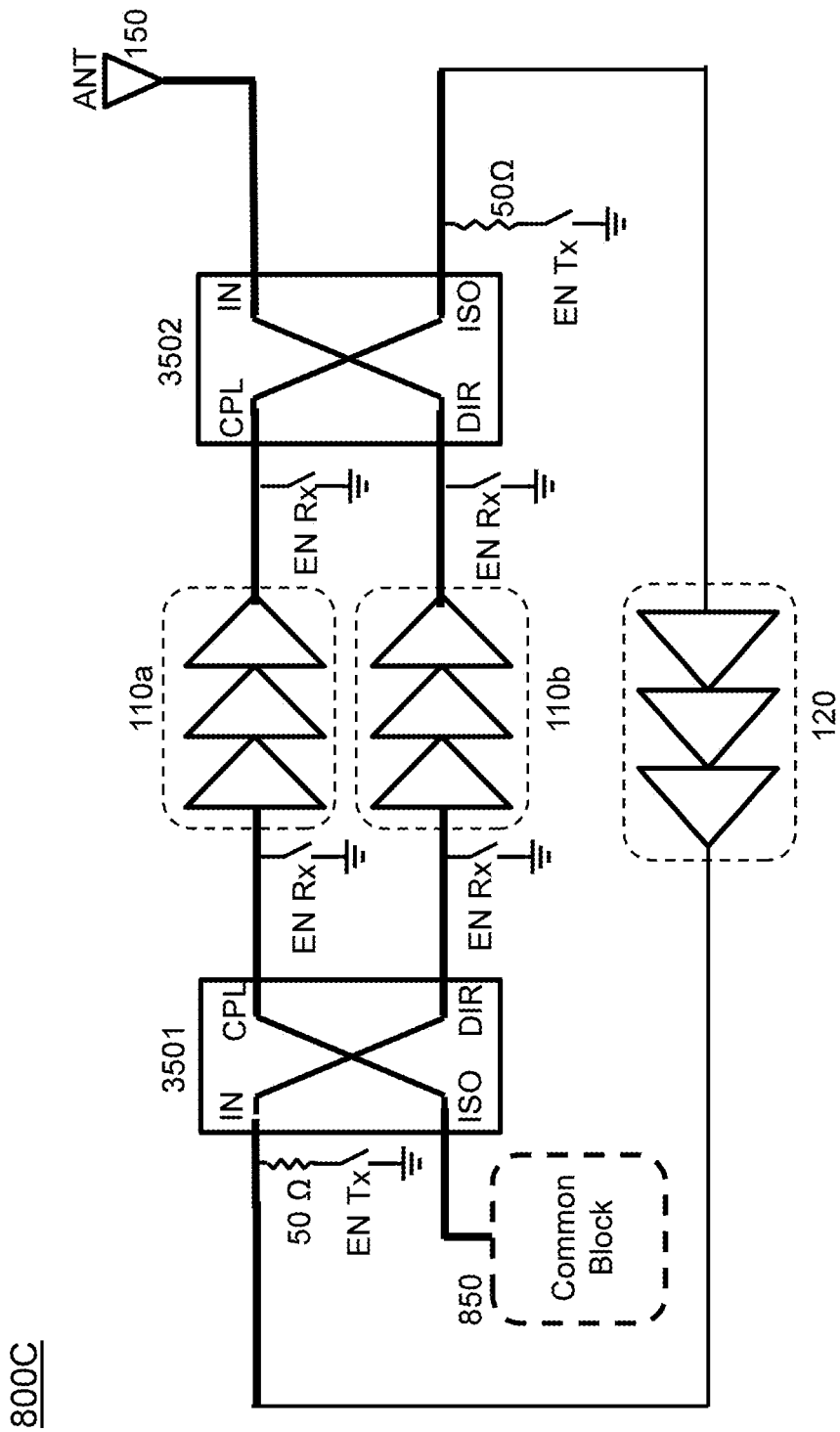
FIG. 8C shows a block diagram of another TDM system according to an embodiment of the present disclosure comprising a balanced amplifier whose input stage hybrid coupler and output stage hybrid coupler each perform the task of a T/R switch.
Figure 8D:
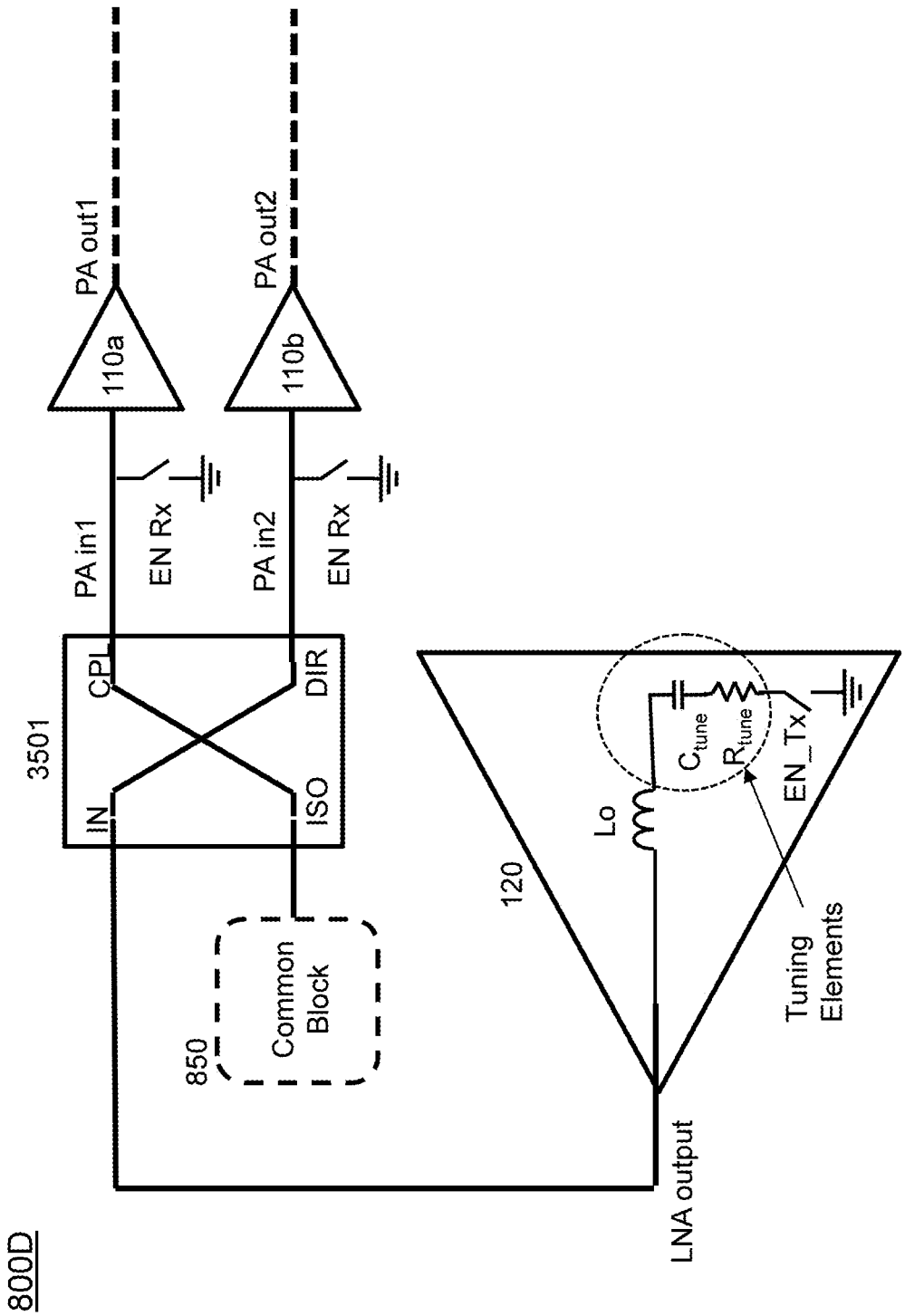
FIG. 8D shows an exemplary embodiment according to the present disclosure based on the TDM system of FIG. 5A, wherein tuning elements are used in the receive path to adjust an impedance seen by the input stage hybrid coupler looking into the receive path.

With continued reference to FIG. 8B and based on the above description of the various embodiments of the present disclosure, a person skilled in the art would clearly understand the principle of operation of the switching function of the RF signals based on the input hybrid coupler (3501) shown in FIG. 8B. A person skilled in the art would also understand that although the configuration of FIG. 8B shows switching functions performed by both the input hybrid coupler (3501) and the output hybrid coupler (3502), anyone configuration using either one of such couplers as a switch is possible as dictated by design goals and requirements. Additionally, a person skilled in the art would understand that although the configuration shown in FIG. 8B is based on the configuration of FIG. 7A where improvement in isolation between the transmit and receive paths may be provided via the (optional) switchable conduction paths (720, 720a), other configurations according to the present disclosure may be used to implement a switching function based on a corresponding input hybrid coupler (3501). Accordingly, any of the configuration according to the present teachings may be used independently by way of the input and/or the output hybrid couplers (3501, 3502). For example, FIG. 8C shows a configuration according to the present disclosure similar to the configuration shown in FIG. 8B but without the switchable conduction paths (720, 720a), and FIG. 8D shows another configuration according to the present disclosure where tuning elements are used to control an impedance termination at a port of the input hybrid coupler (3501) in a manner similar to one described above in reference to FIG. 6A. In the case of the configuration depicted in FIG. 8D, since the LNA amplifier (120) is connected to the hybrid coupler (3501) by way of an output impedance, Lo, of the LNA amplifier (120), tuning of the impedance termination is performed in view of the output impedance, Lo, of the LNA amplifier (120) as shown in FIG. 8D. It should be noted that the output impedance, Lo, may be the output impedance of the LNA amplifier (120) in its deactivated state (i.e., during a transmission phase of the system).

It should be noted that the various embodiments of the hybrid coupler-based T/R switch according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", U.S. Pat. No. 7,123,898, issued on Oct. 17, 2006, entitled "Switch Circuit and Method of Switching Radio Frequency Signals", U.S. Pat. No. 7,890,891, issued on Feb. 15, 2011, entitled "Method and Apparatus Improving Gate Oxide Reliability by Controlling Accumulated Charge", and U.S. Pat. No. 8,742,502, issued on Jun. 3, 2014, entitled "Method and Apparatus for use in Improving Linearity of MOSFETs Using an Accumulated Charge Sink—Harmonic Wrinkle Reduction", the disclosures of which are incorporated herein by reference in their entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuit arrangement comprising:
a balanced amplifier comprising an output hybrid coupler comprising a first port, coupled port (CPL), a second port, direct port (DIR), a third port, isolated port (ISO), and a fourth port, input port (IN), the fourth port, IN, being configured for connection to an antenna;
first and second shunting switches of a first set of switches, respectively coupled to the first port, CPL, and the second port, DIR; and
a third shunting switch of the first set of switches coupled to the third port, ISO, through a series-connected terminating resistor;
wherein during a first mode of operation of the circuit arrangement:
the first and second shunting switches are open so that amplified phase-shifted signals of the balanced amplifier respectively coupled to the first port, CPL, and the second port, DIR, are combined at the fourth port, IN, and the third shunting switch is closed so to provide a terminating impedance to a residual signal of the amplified phase-shifted signals, and wherein during a second mode of operation of the circuit arrangement:
the first and second shunting switches are closed so that a signal at the fourth port, IN, is divided at, and reflected from, the first port, CPL, and the second port, DIR, to combine at the third port, ISO, and
the third shunting switch is open.

2. The circuit arrangement according to claim 1, wherein during the second mode of operation, the signal at the third port, ISO, has a ninety degrees phase shift with respect to the signal at the fourth port, IN.

3. The circuit arrangement according to claim 1, wherein the terminating resistor is connected to the third port, ISO.

4. The circuit arrangement according to claim 1, further comprising a low noise amplifier, LNA, coupled to the third port, ISO.

5. The circuit arrangement according to claim 4, wherein the third shunting switch is further coupled to the third port, ISO, through elements of an input match of the low noise amplifier.

6. The circuit arrangement according to claim 5, wherein the third shunting switch is further coupled to the third port, ISO, through one or more reactive elements that are series-connected to the terminating resistor.

7. The circuit arrangement according to claim 5, wherein during the second mode of operation, a combined impedance seen by the third port, ISO, looking into the low noise amplifier, is substantially equal to an impedance seen at the fourth port.

8. The circuit arrangement according to claim 3, further comprising a switchable conduction path coupled to the third port, ISO, the switchable conduction path comprising:
a quarter wavelength transmission line based on a frequency of the signal at fourth port IN; and
an additional shunting switch coupled at an end of the quarter wavelength transmission line away from the third port, ISO,
wherein during the first mode of operation, the additional shunting switch is closed so to provide an open seen by the third port, ISO, looking into the switchable conduction path, and
wherein during the second mode of operation, the additional shunting switch is open.

9. The circuit arrangement according to claim 8, further comprising a low noise amplifier, LNA, coupled to the additional shunting switch.

10. The circuit arrangement according to claim 1, further comprising an antenna connected to the fourth port, IN.

11. The circuit arrangement according to claim 1, further comprising a second set of switches comprising first, second and third shunting switches, wherein:
the first and second shunting switches of the second set are respectively coupled to a first port, CPL, and as second port, DIR, of an input hybrid coupler of the balanced amplifier,
the third shunting switch of the second set is coupled to a fourth port, IN, of the input hybrid coupler by way of a second terminating resistor,
wherein during the first and the second modes of operation, open and closed states of the second set of switches are same as open and closed states of the first state of switches.

12. The circuit arrangement according to claim 11, wherein during the first mode of operation, a signal at a third port, ISO, of the input hybrid coupler, is divided at a first port, CPL, and a second port, DIR, of the input hybrid coupler, and amplified by the balanced amplifier to provide the amplified phase-shifted signals, and
wherein during the second mode of operation, a signal at the fourth port, IN, of the input hybrid coupler, is divided at, and reflected from, the first port, CPL, and the second port DIR, of the input hybrid coupler, to combine at the third port, ISO, of the input hybrid coupler.

13. The circuit arrangement according to claim 12, wherein during the second mode of operation, the signal at the fourth port, IN, of the input hybrid coupler, is an amplified version of the signal at the third port, ISO, of the output hybrid coupler.

14. The circuit arrangement according to claim 13, wherein the third port, ISO, of the input hybrid coupler is configured for connection to a signal processing block that:
generates a signal for amplification by the balanced amplifier and transmission via an antenna connected to the fourth port, ISO, of the output hybrid coupler during the first mode of operation, and
processes a signal received by the antenna during the second mode of operation.

15. The circuit arrangement according to claim 1, wherein the circuit arrangement is monolithically integrated.

16. The circuit arrangement according to claim 15, wherein the circuit arrangement is monolithically integrated by using a fabrication technology comprising one of: a) silicon-on-insulator (SOI) technology, and b) silicon-on-sapphire technology (SOS).

17. The circuit arrangement according to claim 1, wherein each switch of the first set of switches is a field-effect transistor, FET, based switch comprising one or more stacked FETs.

18. The circuital arrangement according to claim 17, wherein the one or more stacked FETs are metal-oxide-semiconductor (MOS) FETs, or complementary metal-oxide-semiconductor (CMOS) FETs.

19. The circuital arrangement according to claim 1, wherein the circuital arrangement is adapted to transmit and receive a signal via an antenna connected at the fourth port, IN, that has a frequency equal to, or greater than, 1 GHz.

20. The circuital arrangement according to claim 1, wherein the circuital arrangement is adapted to transmit and receive a signal via an antenna connected at the fourth port, IN, that has a frequency equal to, or greater than, 10 GHz.

21. An electronic module comprising the circuit arrangement according to claim 1.

22. A phased array element comprising the circuit arrangement according to claim 1.

23. A method, comprising using of the electronic module of claim 21 in one or more electronic systems comprising: a) a television, b) a cellular telephone, c) a personal computer, d) a workstation, e) a radio, f) a video player, g) an audio player, h) a vehicle, i) a medical device, and j) other electronic systems.

24. A circuit arrangement comprising:
a balanced amplifier comprising an input hybrid coupler and an output hybrid coupler; and
a first set of shunting switches, comprising first, second, and third shunting switches, respectively coupled to ports: coupled port (CPL); direct port (DIR); and input port (IN), of the input hybrid coupler,
wherein open and closed states of the switches of the first set of shunting switches are configured to control operation of the input hybrid coupler as a hybrid coupler-based switch comprising a first state and a second state, wherein in the first state, a signal at a port, isolated port (ISO), of the input hybrid coupler is divided at the ports CPL and DIR of the input hybrid coupler to generate input quadrature signals for amplification by the balanced amplifier, and wherein in the second state, a signal at the port IN of the input hybrid coupler is divided at, and reflected from, the ports CPL and DIR of the input hybrid coupler, to combine at the fourth port ISO of the input hybrid coupler.

* * * * *